United States Patent
Sana et al.

(10) Patent No.: US 12,470,219 B2
(45) Date of Patent: Nov. 11, 2025

(54) FREEZE ENABLED SWING LEVEL SHIFTER

(71) Applicant: QUALCOMM Incorporated, San Diego, CA (US)

(72) Inventors: Pradeep Kumar Sana, Bangalore (IN); Mohammad Wasim Sayed, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 117 days.

(21) Appl. No.: 18/633,959

(22) Filed: Apr. 12, 2024

(65) Prior Publication Data
US 2025/0323645 A1    Oct. 16, 2025

(51) Int. Cl.
H03K 19/0185    (2006.01)
H03K 3/037    (2006.01)
H03K 17/687    (2006.01)

(52) U.S. Cl.
CPC ..... *H03K 19/018507* (2013.01); *H03K 3/037* (2013.01); *H03K 17/6871* (2013.01)

(58) Field of Classification Search
None
See application file for complete search history.

(56) References Cited

U.S. PATENT DOCUMENTS

| | | | |
|---|---|---|---|
| 8,810,304 B2* | 8/2014 | Song | H03K 19/0016 327/541 |
| 9,997,208 B1* | 6/2018 | Jung | G11C 7/12 |
| 12,081,215 B2* | 9/2024 | Ou | H03K 3/356182 |
| 2010/0201427 A1 | 8/2010 | Van Den Berg et al. | |

* cited by examiner

*Primary Examiner* — Cassandra F Cox
(74) *Attorney, Agent, or Firm* — Loza & Loza, LLP

(57) ABSTRACT

A system includes a circuit in a first power domain, a first tri-state inverter having an input coupled to the circuit, and a second tri-state inverter having an input coupled to an output of the first tri-state inverter. The system also includes a level shifter in a second power domain, wherein the level shifter has a first input coupled to the output of the first tri-state inverter and a second input coupled to an output of the second tri-state inverter. The system also includes a shunt switch, a controller, and a pass gate. The shunt switch is coupled between the first input of the level shifter and ground or coupled between the second input of the level shifter and ground. The pass gate is coupled between the controller and the second input of the level shifter or coupled between the controller and the first input of the level shifter.

20 Claims, 7 Drawing Sheets

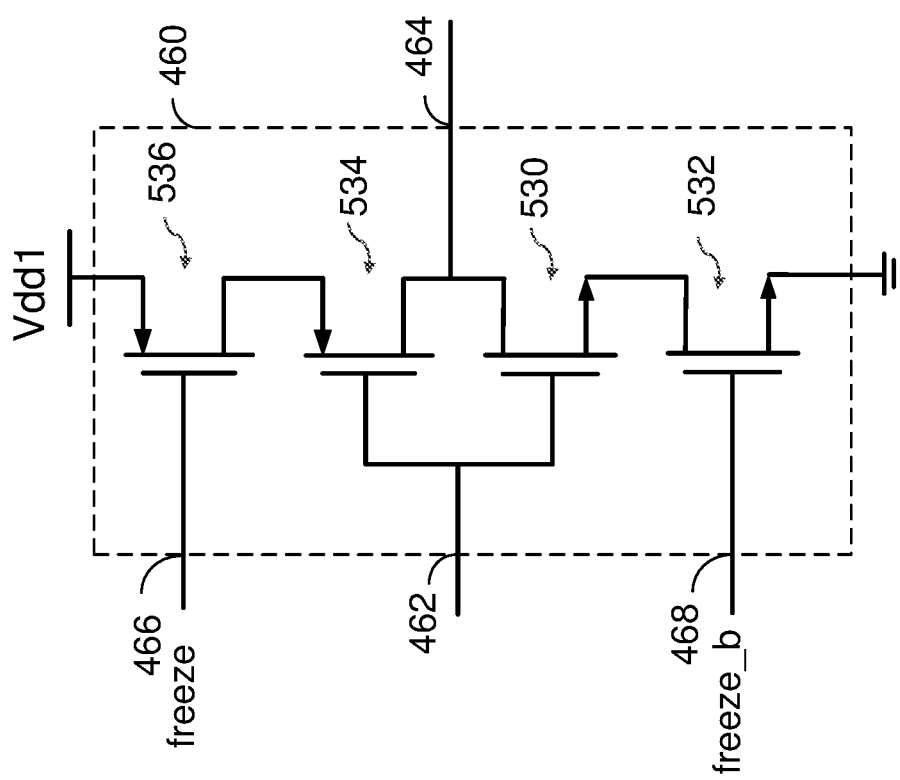

FREEZE ENABLED SWING LEVEL SHIFTER

FIELD

Aspects of the present disclosure relate generally to level shifters, and more particularly, to freeze enabled level shifters.

BACKGROUND

A chip may include multiple power domains, in which each power domain may be powered by a separate supply rail. The multiple power domains allow circuits in the different power domains to be powered at different supply voltages. The power domains may be independently power collapsed such that one power domain may be powered on while another power domain is power collapsed (e.g., to conserve power). The chip may also include level shifters that allow signals to cross from one power domain to another power domain.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a circuit in a first power domain, a first tri-state inverter having an input and an output, wherein the input of the first tri-state inverter is coupled to the circuit, and a second tri-state inverter having an input and an output, wherein the input of the second tri-state inverter is coupled to the output of the first tri-state inverter. The system also includes a level shifter in a second power domain, wherein the level shifter has a first input and a second input, the first input of the level shifter is coupled to the output of the first tri-state inverter, and the second input of the level shifter is coupled to the output of the second tri-state inverter. The system also includes a shunt switch coupled between the first input of the level shifter and a ground, a controller, and a pass gate coupled between the controller and the second input of the level shifter.

A second aspect relates to a system. The system includes a circuit in a first power domain, a first tri-state inverter having an input and an output, wherein the input of the first tri-state inverter is coupled to the circuit, and a second tri-state inverter having an input and an output, wherein the input of the second tri-state inverter is coupled to the output of the first tri-state inverter. The system also includes a level shifter in a second power domain, wherein the level shifter has a first input and a second input, the first input of the level shifter is coupled to the output of the first tri-state inverter, and the second input of the level shifter is coupled to the output of the second tri-state inverter. The system also includes a shunt switch coupled between the second input of the level shifter and a ground, a controller, and a pass gate coupled between the controller and the first input of the level shifter.

BRIEF DESCRIPTION OF THE DRAWINGS

FIG. 5C shows an exemplary implementation of a second tri-state inverter according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A chip may include multiple power domains, in which each power domain may be powered by a separate supply rail. A power domain may also be referred to as a voltage domain, a supply domain, or another term. The multiple power domains allow circuits in the different power domains to be powered at different supply voltages. Examples of power domains may include a memory (MX) power domain for powering embedded memory, a core (CX) power domain for powering core logic, and an input/output (I/O) power domain for powering I/O circuits (e.g., output drivers). However, it is to be appreciated that the present disclosure is not limited to these examples. The power domains may be independently power collapsed such that one power domain may be powered on while another power domain is power collapsed (e.g., to conserve power). The chip may also include level shifters that allow signals to cross from one power domain to another power domain.

Figure 1:
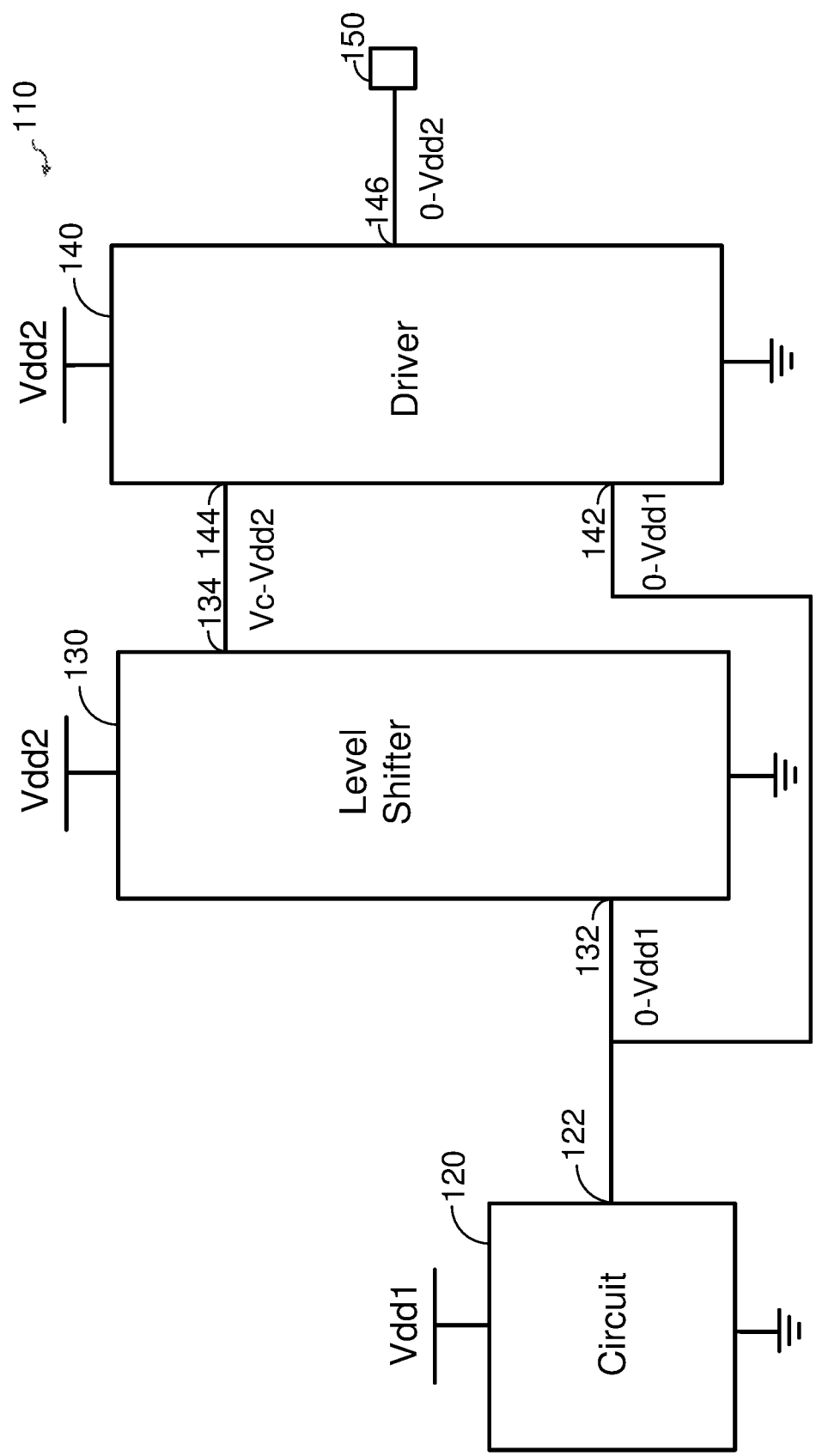
FIG. 1 shows an example of a chip including a first power domain and a second power domain according to certain aspects of the present disclosure.

FIG. 1 shows an example of a chip 110 including a first power domain and a second power domain according to certain aspects. The first power domain has a first supply voltage Vdd1 and the second power domain has a second supply voltage Vdd2, in which the second supply voltage Vdd2 is greater than the first supply voltage Vdd1 (i.e., Vdd1<Vdd2). The first power domain may be an MX power domain, a CX power domain, or another power domain. The second power domain may be an I/O power domain or another power domain. The supply voltages Vdd1 and Vdd2 may be provided by voltage regulators (not shown) configured to generate the supply voltages Vdd1 and Vdd2 (e.g., from a battery, a power adapter, etc.). The voltage regulators may include switching regulators, low dropout (LDO) regulators, or any combination thereof.

In the example shown in FIG. 1, the chip 110 includes a circuit 120 in the first power domain, a level shifter 130 in the second power domain, and a driver 140 (e.g., output driver) in the second power domain. The circuit 120 may include embedded memory, a processor, and/or another type of circuit operating in the first power domain. The circuit 120 outputs a first signal at an output 122 having a voltage swing of approximately 0-Vdd1 (i.e., the first signal swings between ground potential and Vdd1). A level shifter may also be referred to as a swing level shifter, a voltage-level shifter, a voltage-level translator, or another term.

The level shifter 130 has an input 132 and an output 134. The input 132 is coupled to the output 122 of the circuit 120 to receive the first signal from the circuit 120. Although not shown in FIG. 1, it is to be appreciated that one of more buffers (e.g., inverters) may be coupled between the output 122 of the circuit 120 and the input 132 of the level shifter 130.

The level shifter 130 is configured to shift the voltage swing of the first signal from the circuit 120 to generate a second signal having a voltage swing of approximately Vc-Vdd2 where Vc is an intermediate voltage between Vdd2 and ground potential. In certain aspects Vc may be equal to Vdd2-Vdd1 or another voltage. The level shifter 130 outputs the second signal at the output 134. In one example, Vdd1 may be approximately 0.7 volts, Vc may be approximately 0.5 volts, and Vdd2 may be approximately 1.2 volts. However, it is to be appreciated that the present disclosure is not limited to this example, and that Vdd1, Vdd2, and Vc may have other voltages in other examples. In certain aspects, the first supply voltage Vdd1 may be equal to or less than 80 percent of the second supply voltage Vdd2.

The driver 140 has a first input 142, a second input 144, and an output 146. The first input 142 of the driver 140 is coupled to the circuit 120 to receive the first signal, which has a voltage swing of 0-Vdd1. The second input 144 of the driver 140 is coupled to the output 134 of the level shifter 130 to receive the second signal, which has a voltage swing of Vc-Vdd2. The driver 140 is configured to output an output signal at the output 146 based on the first signal and the second signal. The output signal of the driver 140 may have a voltage swing of approximately 0-Vdd2 (i.e., the output signal swings between ground potential and Vdd2). However, it is to be appreciated that the present disclosure is not limited to this example.

In the example shown in FIG. 1, the output 146 of the driver 140 is coupled to a pad 150 to drive the output signal off chip. The pad 150 may be coupled to an external chip (not shown) via a transmission line. In this example, the driver 140 may drive the transmission line according to a signaling standard, in which the second supply voltage Vdd2 is set to a voltage level complying with the signaling standard. However, it is to be appreciated that the present disclosure is not limited to this example.

Figure 2:
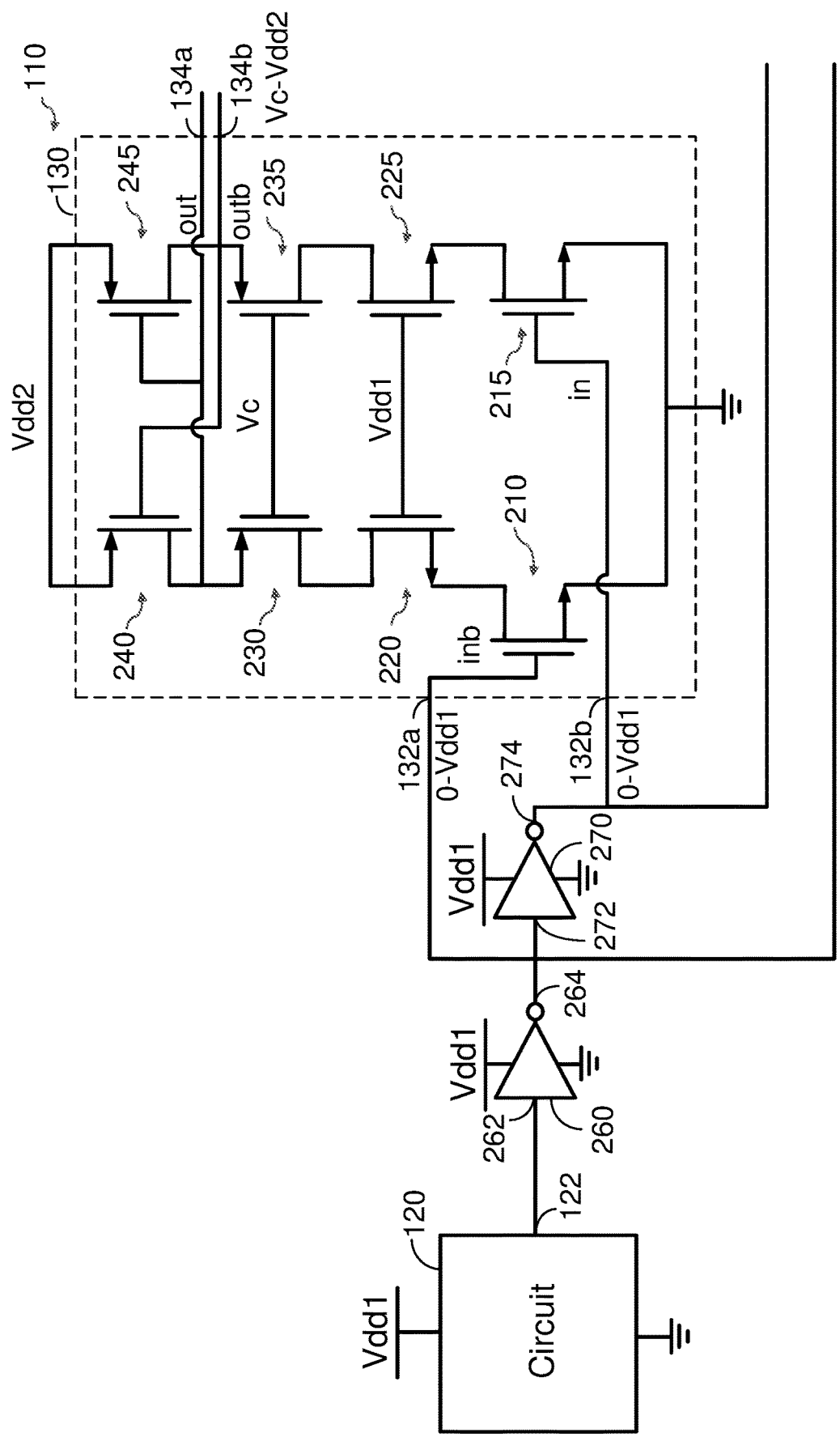
FIG. 2 shows an exemplary implementation of a level shifter according to certain aspects of the present disclosure.

FIG. 2 shows an exemplary implementation of the level shifter 130 according to certain aspects. In this example, the input 132 of the level shifter 130 includes a first input 132a and a second input 132b. Also, the chip 110 includes a first inverter 260 and a second inverter 270 coupled in series between the output 122 of the circuit 120 and the second input 132b of the level shifter 130. More particularly, the input 262 of the first inverter 260 is coupled to the output 122 of the circuit 120, the input 272 of the second inverter 270 is coupled to the output 264 of the first inverter 260, and the output 274 of the second inverter 270 is coupled to the second input 132b of the level shifter 130. The output 264 of the first inverter 260 is coupled to the first input 132a of the level shifter 130. Each of the inverters 260 and 270 is in the first power domain and has an output voltage swing of 0-Vdd1. In this example, the first input 132a and the second input 132b are driven by complementary signals in the first power domain output by the first inverter 260 and the second inverter 270, respectively.

In the example shown in FIG. 2, the output 134 includes a first output 134a and a second output 134b. As discussed further below, the first output 134a and the second output 134b output complementary signals having a voltage swing of approximately Vc-Vdd2. The second input 144 of the driver 140 may be coupled to the first output 134a or the second output 134b. In some implementations, the level shifter 130 may be coupled to two drivers in which one of the drivers is coupled to the first output 134a and the other one of the drivers is coupled to the second output 134b. In this example, the two drivers include the driver 140 and a second driver (which may be a copy of the driver 140), and the two drivers may be used to drive two signal lines with complementary signals. However, it is to be appreciated that the present disclosure is not limited to this example.

The level shifter 130 includes a first transistor 210, a second transistor 215, a third transistor 220, a fourth transistor 225, a fifth transistor 230, a sixth transistor 235, a seventh transistor 240, and an eighth transistor 245. In the example shown in FIG. 2, each of the transistors 210, 215, 220, and 225 is implemented with a respective n-type field effect transistor (NFET), and each of the transistors 230, 235, 240, and 245 is implemented with a respective p-type field effect transistor (PFET). However, it is to be appreciated that the present disclosure is not limited to this example.

The transistors 210, 220, 230, and 240 are stacked between the supply rail for the second supply voltage Vdd2 and ground. The stacking of the transistors 210, 220, 230, and 240 divides the second supply voltage Vdd2 among the transistors 210, 220, 230, and 240, which reduces the voltage stress on each of the transistors 210, 220, 230, and 240. The reduced voltage stress may allow each of the transistors 210, 220, 230, and 240 to be implemented with a thin-gate-oxide transistor (also referred to as a low-voltage transistor). Similarly, the transistors 215, 225, 235, and 245 are also stacked between the supply rail for the second supply voltage Vdd2 and ground. The stacking of the transistors 215, 225, 235, and 245 reduces the voltage stress on each of the transistors 215, 225, 235, and 245, with may allow each of the transistors 215, 225, 235, and 245 to be implemented with a thin-gate-oxide transistor.

In the example in FIG. 2, the gate of the first transistor 210 is coupled to the first input 132a, the gate of the second transistor 215 is coupled to the second input 132b, and the sources of the first and second transistors 210 and 215 are coupled to ground. The source of the third transistor 220 is coupled to the drain of the first transistor 210, the source of the fourth transistor 225 is coupled to the drain of the second transistor 215, and the gates of the third and fourth transistors 220 and 225 are biased with the first supply voltage Vdd1. The drain of the fifth transistor 230 is coupled to the drain of the third transistor 220, the drain of the sixth transistor 235 is coupled to the drain of the fourth transistor 225, and the gates of the fifth and sixth transistors 230 and 235 are biased with the voltage Vc, which may be equal to Vdd2-Vdd1 or another voltage.

The drain of the seventh transistor 240 is coupled to the source of the fifth transistor 230, the gate of the seventh transistor 240 is coupled to the drain of the sixth transistor 235, and the source of the seventh transistor 240 is coupled to the supply rail for Vdd2. The drain of the eighth transistor 245 is coupled to the source of the sixth transistor 235, the gate of the eighth transistor 245 is coupled to the drain of the fifth transistor 230, and the source of the eighth transistor 245 is coupled to the supply rail for Vdd2. In this example, the seventh transistor 240 and the eighth transistor 245 are cross coupled, in which the gate of the seventh transistor 240 is coupled to the drain of the eighth transistor 245, and the gate of the eighth transistor 245 is coupled to the drain of the seventh transistor 240. The cross-coupling of the transistors 240 and 245 causes one of the transistors 240 and 245 to turn on and the other one of the transistors 240 and 245 to turn off based on the signals at the first input 132a and the second input 132b of the level shifter 130 from the inverters 270 and 260, respectively.

In the example shown in FIG. 2, the first output of the 134a of the level shifter 130 is coupled between the drain of the seventh transistor 240 and the drain of the fifth transistor 230, and the second output 134b is coupled to the drain of the eighth transistor 245 and the drain of the sixth transistor 235. In this example, the fifth transistor 230 and the sixth transistor 235 (which are gate biased by Vc) help prevent the voltages at the outputs 134a and 134b, respectively, from dropping below Vc to keep the output voltage swings at the outputs 143 and 143b between Vc and Vdd2.

During operation, when the first inverter 260 outputs approximately Vdd1 (i.e., logic one) to the first input 132a of the level shifter 130 and the second inverter 270 outputs approximately zero volts (i.e., logic zero) to the second input 132b of the level shifter 130, the first transistor 210 turns on and the second transistor 215 turns off. This may cause the level shifter 130 to pull down the first output 134a to approximately Vc. In this case, the fifth transistor 230 (which is gate biased by Vc) prevents the first output 134a from going below Vc. Also, the pulling down of the first output 134a turns on the eighth transistor 245 since the gate of the eighth transistor 245 is coupled to the first output 134a. The turning on of the eighth transistor 245 causes the eighth transistor 245 to pull up the second output 134b to approximately Vdd2.

When the first inverter 260 outputs approximately zero (i.e., logic zero) to the first input 132a of the level shifter 130 and the second inverter 270 outputs approximately Vdd1 (i.e., logic one) to the second input 132b of the level shifter 130, the first transistor 210 turns off and the second transistor 215 turns on. This may cause the level shifter 130 to pull down the second output 134b to approximately Vc. In this case, the sixth transistor 235 (which is gate biased by Vc) prevents the second output 134b from going below Vc. Also, the pulling down of the second output 134b turns on the seventh transistor 240 since the gate of the seventh transistor 240 is coupled to the second output 134b. The turning on of the seventh transistor 240 causes the seventh transistor 240 to pull up the first output 134a to approximately Vdd2.

Figure 3:
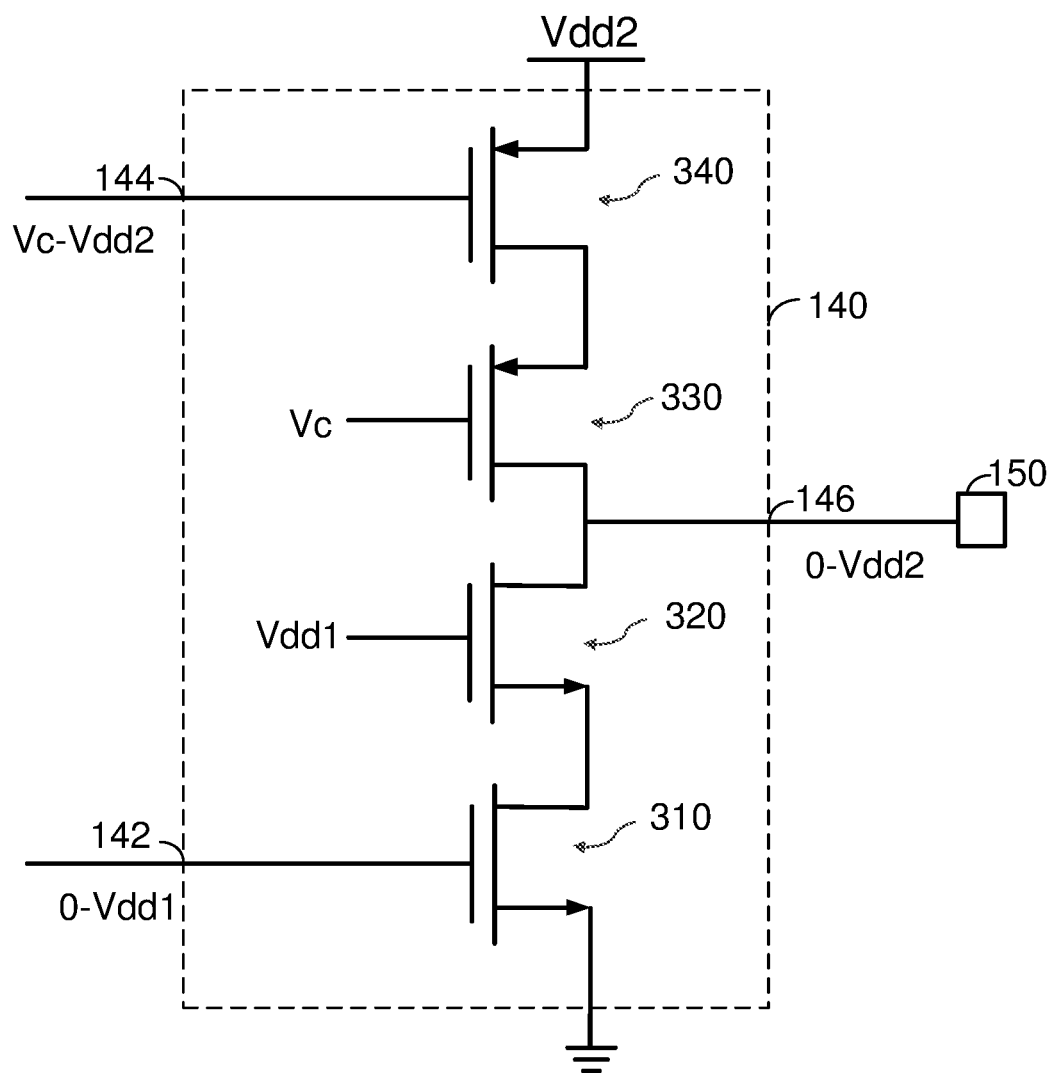
FIG. 3 shows an exemplary implementation of a driver including stacked transistors according to certain aspects of the present disclosure.

FIG. 3 shows an exemplary implementation of the driver 140 according to certain aspects. In this example, the driver 140 includes a first transistor 310, a second transistor 320, a third transistor 330, and a fourth transistor 340. Each of the first and second transistors 310 and 320 is implemented with a respective NFET, and each of the third and four transistors 330 and 340 is implemented with a respective PFET. However, it is to be appreciated that the present disclosure is not limited to this example.

The transistors 310, 320, 330, and 340 are stacked between the supply rail for the second supply voltage Vdd2 and ground. The stacking of the transistors 310, 320, 330, and 340 divides the second supply voltage Vdd2 among the transistors 310, 320, 330, and 340, which reduces the voltage stress on each of the transistors 310, 320, 330, and 340. The reduced voltage stress may allow each of the transistors 310, 320, 330, and 340 to be implemented with a thin-gate-oxide transistor (also referred to as a low-voltage transistor).

In the example in FIG. 3, the gate of the first transistor 310 is coupled to the first input 142 of the driver 140, and the source of the first transistor 310 is coupled to ground. The gate of the second transistor 320 is biased by Vdd1, and the source of the second transistor 320 is coupled to the drain of the first transistor 310. The gate of the third transistor 330 is biased by Vc, and the drain of the third transistor 330 is coupled to the drain of the second transistor 320. The gate of the fourth transistor 340 is coupled to the second input 144, the drain of the fourth transistor 340 is coupled to the source of the third transistor 330, and the source of the fourth transistor 340 is coupled to supply rail for the second supply voltage Vdd2. In this example, the output 146 of the driver 140 is coupled between the drains of the second transistor 320 and the third transistor 330. In this example, the third transistor 330 protects the fourth transistor 340 from over voltage stress by limiting the voltage across the fourth transistor 340 to Vdd2-Vc, and the second transistor 320 protects the first transistor 310 from over voltage stress by limiting the voltage across the first transistor 310 to Vdd1.

The first input 142 may be coupled to the output 274 of the second inverter 270 and the second input 144 may be coupled to the first output 134a of the level shifter 130. Alternatively, the first input 142 may be coupled to the output 264 of the first transistor 260 and the second input 144 may be coupled to the second output 134b of the level shifter 130.

During operation, the output 146 of the driver 140 is driven to Vdd2 or ground potential based on the signals input to the first input 142 and the second input 144 of the driver 140. For example, when the signal at the first input 142 is approximately Vdd1 and the signal at the second input 144 is approximately Vdd2, the first transistor 310 turns on and the fourth transistor 340 turns off. This causes the driver 140 to pull down the output 146 to approximately ground potential through the first and second transistors 310 and 320. When the signal at the first input 142 is approximately zero volts and the signal at the second input 144 is approximately Vc, the first transistor 310 turns off and the fourth transistor 340 turns on. This causes the driver 140 to pull up the output 146 to approximately Vdd2 through the third and fourth transistors 330 and 340.

In certain aspects, a power manager may selectively power collapse the first power domain (e.g., when the circuit 120 is not being used to reduce leakage power). For example, the power manager may control power to the first domain by controlling the on/off states of power switches (not shown) coupled between a power source (not shown) and the supply rail for the first supply voltage Vdd1. In this example, the power manager may power on the first power domain by closing the power switches and power collapse the first power domain by opening the power switches.

When the first power domain is power collapsed, a freeze circuit may be used to place the level shifter 130 in a known state. Existing freeze circuits for level shifters require thick-gate-oxide transistors capable of handling voltage stress of up to Vdd2 or more, which may be much greater than Vdd1. However, thick-gate-oxide transistors increase costs and may not be available on the chip 110. For example, some advance process nodes do not support or provide thick-gate-oxide transistors.

Figure 4:
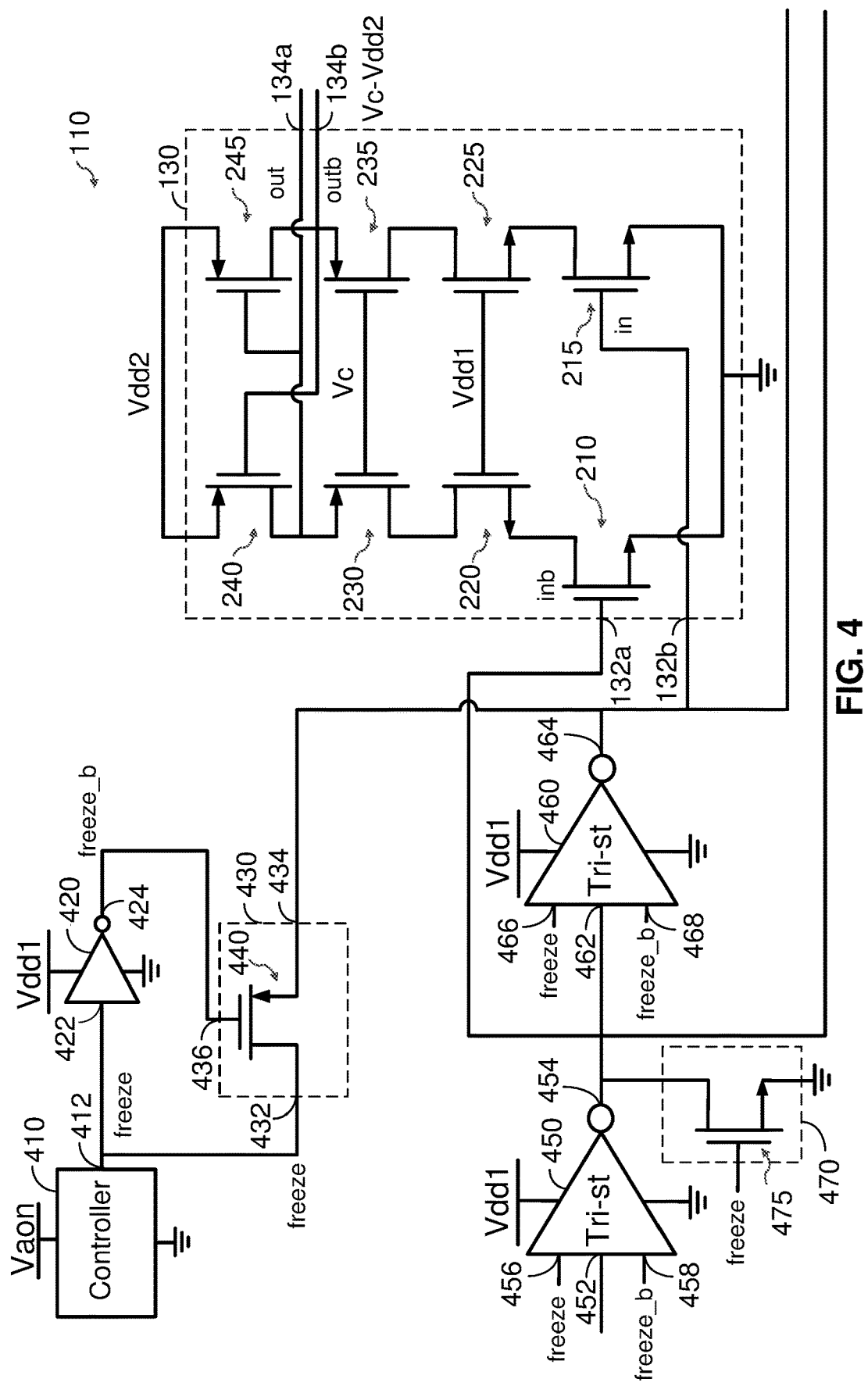
FIG. 4 shows an example of a circuit for selectively freezing the level shifter according to certain aspects of the present disclosure.

To address the above, FIG. 4 shows an example of a freeze circuit that may be implemented using thin-gate-oxide transistors according to certain aspects of the present disclosure. In this example, the freeze circuit includes a first tri-state inverter 450 and a second tri-state inverter 460 in place of the first inverter 260 and the second inverter 270 in FIG. 2. As used herein, a tri-state inverter is an inverter with three possible output states: a low state (i.e., logic zero), a high state (i.e., logic one), and a high-impedance output state (also referred to as open). In this example, the freeze circuit also includes an inverter 420, a pass gate 430, and a shunt switch 470 (also referred to as a pull-down switch). The inverter 420, the first tri-state inverter 450, and the second tri-state inverter 460 are powered in the first power domain.

In this example, the freeze circuit receive a freeze signal (labeled "freeze") from a controller 410 that controls whether the freeze circuit is in a first mode or a second mode. In the first mode (also referred to as the functional mode), the freeze circuit allows the circuit 120 (shown in FIG. 2) to drive the level shifter 130 when the first power domain is powered on. In the second mode (also referred to as the freeze mode), the freeze circuit places the level shifter 130 in a known state (e.g., when the first power domain is power collapsed). In this example, the freeze circuit may be in the first mode (i.e., functional mode) when the freeze signal is low (i.e., logic zero) and in the second mode (i.e., the freeze mode) when the freeze signal is high (i.e., logic one). However, it is to be appreciated that the present disclosure is not limited to this example. The controller 410 may be implemented with gated logic, a field programmable gate array (FPGA), programmable logic devices (PLDs), discrete hardware circuits, and/or other suitable hardware.

In the example in FIG. 4, the controller 410 is powered in an always-on power domain having a supply voltage Voan. As used herein, an "always-on" power domain may be a power domain that is on while the chip 110 receives power from an external power source. The supply voltage Voan may be approximately equal to the first supply voltage Vdd. In this example, the always-on power domain keeps the controller 410 powered on when the first power domain is power collapsed. This allows the controller 410 to output the freeze signal while the first power domain is power collapsed.

In this example, the inverter 420 is in the first power domain. The input 422 of the inverter 420 is coupled to the output 412 of the controller 410 to receive the freeze signal. The inverter 420 is configured to invert the freeze signal to generate an inverse freeze signal (labeled "freeze_b") and output the inverse freeze signal at the output 424 of the inverter 420. As discussed further below, the inverter 420 is able to output the inverse freeze signal when the inverse freeze signal is low (i.e., logic zero) even when the first power domain is power collapsed.

The first tri-state inverter 450 has a first input 452, a second input 456, a third input 458, and an output 454. The first input 452 is coupled to the circuit 120 (shown in FIG. 2), the second input 456 is coupled to the output 412 of the controller 410 to receive the freeze signal, and the third input 458 is coupled to the output 424 of the inverter 420 to receive the inverse freeze signal. For ease of illustration, the individual connections between the first tri-state inverter 450 and the controller 410 and the inverter 420 are not shown in FIG. 4. In this example, the output 454 of the first tri-state inverter 450 is coupled to the first input 132a of the level shifter 130 (e.g., the gate of the first transistor 210).

In this example, when the freeze signal is low (e.g., ground potential) and the inverse freeze signal is high (e.g., Vdd1), the first tri-state inverter 450 is enabled and functions as a inverter that inverts the input signal at the first input 452 and outputs the inverse of the input signal at the output 454. The output 454 of the first tri-state inverter 450 may have an output swing of 0–Vdd1. When the freeze signal is high and the inverse freeze signal is low, the output 454 of the first tri-state inverter 450 has a high impedance (i.e., the first tri-state inverter 450 is placed in the high-impedance output state). In other words, the first tri-state inverter 450 is disabled (i.e., does not function as an inverter).

The second tri-state inverter 460 has a first input 462, a second input 466, a third input 468, and an output 464. The first input 462 is coupled to the output 454 of the first tri-state inverter 450, the second input 466 is coupled to the output 412 of the controller 410 to receive the freeze signal, and the third input 468 is coupled to the output 424 of the inverter 420 to receive the inverse freeze signal. For ease of illustration, the individual connections between the second tri-state inverter 460 and the controller 410 and the inverter 420 are not shown in FIG. 4. In this example, the output 464 of the second tri-state inverter 460 is coupled to the second input 132b of the level shifter 130 (e.g., the gate of the second transistor 215).

In this example, when the freeze signal is low (e.g., ground potential) and the inverse freeze signal is high (e.g., Vdd1), the second tri-state inverter 460 is enabled and functions as an inverter that inverts the input signal at the first input 462 and outputs the inverse of the input signal at the output 464. The output 464 of the second tri-state inverter 460 may have an output swing of 0–Vdd1. When the freeze signal is high and the inverse freeze signal is low, the output 464 of the second tri-state inverter 460 has a high impedance (i.e., the second tri-state inverter 460 is placed in a high-impedance output state). In other words, the second tri-state inverter 460 is disabled (i.e., does not function as an inverter).

The shunt switch 470 is coupled between the first input 132a of the level shifter 130 and ground. The on/off state of the shunt switch 470 is controlled by the freeze signal output by the controller 410. In this example, the shunt switch 470 (also referred to as a pull-down switch) is configured to turn off when the freeze signal is low and turn on when the freeze signal is high. When the shunt switch 470 is turned on, the shunt switch 470 is configured to pull the first input 132a of the level shifter 130 to ground potential. In the example shown in FIG. 4, the shunt switch 470 is implemented with an NFET 475, in which the drain of the NFET 475 is coupled to the output 454 of the first tri-state inverter 450, the gate of the NFET 475 is driven by the freeze signal, and the source of the NFET 475 is coupled to ground. However, it is to be appreciated that the present disclosure is not limited to this example.

The pass gate 430 has an input 432 coupled to the output 412 of the controller 410 and an output 434 coupled to the second input 132b of the level shifter 130. The pass gate 430 is configured to selectively pass the freeze signal from the controller 410 to the second input 132b of the level shifter 130. In the example shown in FIG. 4, the pass gate 430 has a control input 436 coupled to the output 424 of the inverter 420 to receive the inverse freeze signal. In this example, the pass gate 430 is configured to turn on and pass the freeze signal when the inverse freeze signal is low (e.g., ground potential). When the inverse freeze signal is high (e.g., Vdd1), the pass gate 430 is turned off and the output 434 of the pass gate 430 has a high impedance, which allows the output 464 of the second tri-state inverter 460 to drive the second input 132b of the level shifter 130. In the example shown in FIG. 4, the pass gate 430 is implemented with a PFET 440, in which the gate of the PFET 440 is driven by the inverse freeze signal. However, it is to be appreciated that the present disclosure is not limited to this example.

Exemplary operations of the freeze circuit will now be described according to certain aspects. The controller 410 may place the freeze circuit in the first mode (i.e., functional mode) when the first power domain is powered on. To place the freeze circuit in the first mode, the controller 410 sets the freeze signal low (e.g., ground potential). In the first mode, the inverter 420 inverts the low freeze signal, causing the inverse freeze signal to go high (e.g., Vdd1). Thus, in first mode, the freeze signal is logic zero and the inverse freeze signal is logic one. This causes the shunt switch 470 to turn off and the output 434 of the pass gate 430 to have the high impedance (i.e., the pass gate 430 to turn off). This also enables the first tri-state inverter 450 and the second tri-state inverter 460.

Since the shunt switch 470 is turned off, the output 454 of the first tri-state inverter 450 is able to drive the first input 132a of the level shifter 130 with the inverse of the signal at the first input 452. The output voltage swing of the first tri-state inverter 450 in the first mode may be 0-Vdd1.

The high impedance at the output 434 of the pass gate 430 allows the output 464 of the second tri-state inverter 460 to drive the second input 132b of the level shifter 130 with the inverse of the signal at the first input 462. The output voltage swing of the second tri-state inverter 460 in the first mode may be 0-Vdd1. The high impedance of the pass gate 430 may be equal to the off impedance of the PFET 440 where the off impedance is the impedance of the PFET 440 at the output 434 when the PFET 440 is turned off.

In the first mode, the level shifter 130 drives the first output 134a and the second output 134b between Vc and Vdd2 based on the output signals of the tri-state inverters 450 and 460.

The controller 410 may place the freeze circuit in the second mode (i.e., freeze mode) just before the first power domain is powered collapsed and while the first power domain is power collapsed. To place the freeze circuit in the second mode, the controller 410 sets the freeze signal high (e.g., a voltage equal to Vdd1). Since the controller 410 is powered in the always-on power domain, the controller 410 is able to maintain the freeze signal at logic one when the first power domain is power collapsed.

In the second mode, the inverter 420 inverts the high freeze signal, causing the inverse freeze signal to go low (e.g., ground potential). As discussed further below, the inverter 420 is able to keep the inverse freeze signal at logic zero when the first power domain is power collapsed.

Thus, in second mode, the freeze signal is logic one and the inverse freeze signal is logic zero. This causes the shunt switch 470 to turn on and the pass gate 430 to pass the freeze signal (i.e., the pass gate 430 to turn on). This also places the first tri-state inverter 450 and the second tri-state inverter 460 in the high-impedance output state (i.e., disables the tri-state inverters 450 and 460) in which the output 454 and 464 of each of the tri-state inverters 450 and 460 has the high impedance.

In the second mode, the high output impedance of the first tri-state inverter 450 allows the shunt switch 470 (which is turned on) to pull the first input 132a of the level shifter 130 to ground potential. Thus, in the second mode (i.e., the freeze mode), the first input 132a is set to a known logic state of logic zero.

Also, in the second mode, the freeze signal is coupled to the second input 132b of the level shifter 130 through the pass gate 430. The high output impedance of the second tri-state inverter 460 allows the freeze signal to pull the second input 132b to the voltage of the freeze signal, which may be approximately equal to Vdd1 when the freeze signal is logic one. Thus, in the second mode (i.e., the freeze mode), the second input 132b is set to a known logic state of logic one.

Thus, in the second mode (i.e., the freeze mode), the first input 132a is logic zero and the second input 132b is logic one in this example. This turns off the first transistor 210 and turns on the second transistor 215, which cause the level shifter 130 to pull the first output 134a to approximately Vdd2 and pull the second output 134b to approximately Vc. Thus, in the second mode, the voltage of the first output 134a is held at approximately Vdd2 (e.g., 1.2 V) and the voltage of the second output 134b is held at approximately Vc (e.g., 0.5 V).

Figure 5B:
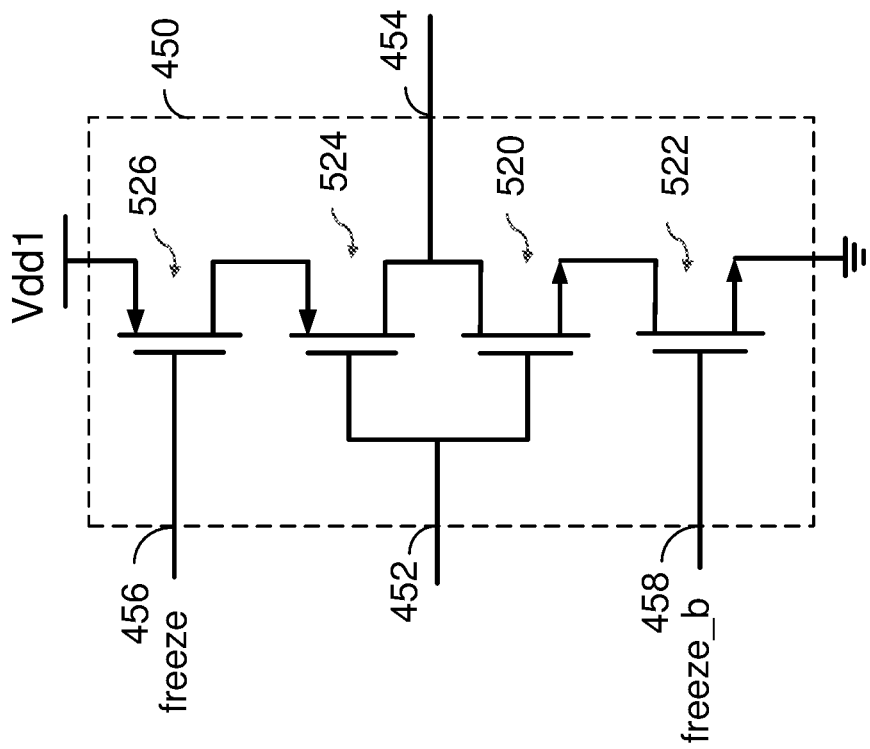
FIG. 5B shows an exemplary implementation of a first tri-state inverter according to certain aspects of the present disclosure.
Figure 5A:
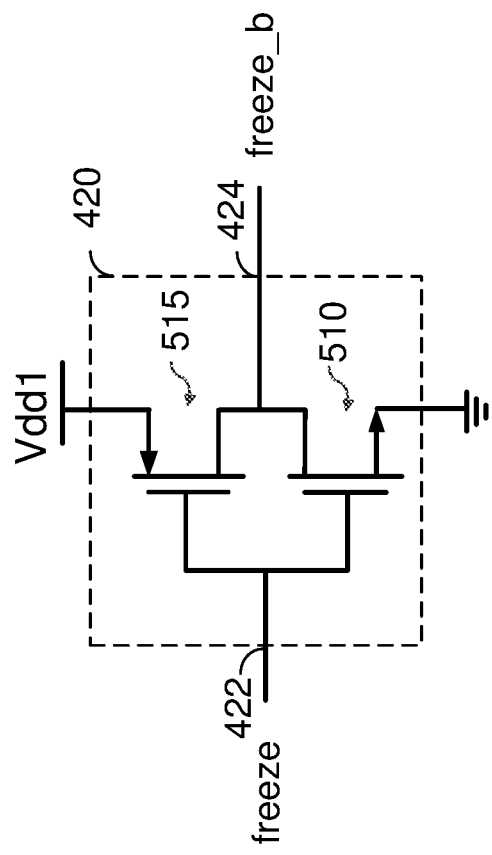
FIG. 5A shows an exemplary implementation of an inverter according to certain aspects of the present disclosure.

FIG. 5A shows an exemplary implementation of the inverter 420. In this example, the inverter 420 includes an NFET 510 and a PFET 515. The gates of the NFET 510 and the PFET 515 are coupled to the input 422, the drains of the NFET 510 and the PFET 515 are coupled to the output 424, the source of the NFET 510 is coupled to ground, and the source of the PFET 515 is coupled to the supply rail for the first supply voltage Vdd1.

In this example, when the freeze signal is low, the PFET 515 turns on and the NFET 510 turns off, causing the inverter 420 to pull up the output 424 to Vdd1 through the PFET 515. In this case, the inverse freeze signal is high (e.g., Vdd1). In this example, the first power domain needs to be powered on for the inverter 420 to set the inverse freeze signal to logic one.

In this example, when the freeze signal is high, the PFET 515 turns off and the NFET 510 turns on, causing the inverter 420 to pull down the output 424 to ground potential through the NFET 510. In this case, the inverse freeze signal is low (e.g., ground potential). In this example, the inverter 420 is able to keep the output 424 low (i.e., hold the inverse freeze signal at logic zero) after the first power domain is power collapsed. This is because the freeze signal at the gate of the NFET 510 keeps the NFET 510 turned on after the first power domain is power collapsed, which allows the NFET 510 to keep the output 424 coupled to ground.

FIG. 5B shows an exemplary implementation of the first tri-state inverter 450. In this example, the first tri-state inverter 450 includes a first NFET 520, a second NFET 522, a first PFET 524, and a second PFET 526. The gates of the first NFET 520 and the first PFET 524 are coupled to the first input 452 and the drains of the first NFET 520 and the first PFET 524 are coupled to the output 454. The gate of the second NFET 522 is coupled to the third input 458 to receive the inverse freeze signal, the drain of the second NFET 522 is coupled to the source of the first NFET 520, and the source of the second NFET 522 is coupled to ground. The gate of the second PFET 526 is coupled to the second input 456 to receive the freeze signal, the drain of the second PFET 526 is coupled to the source of the first PFET 524, and the source of the second PFET 526 is coupled to the supply rail for the first supply voltage Vdd1.

In this example, when the freeze signal is logic zero and the inverse freeze signal is logic one, the second NFET 522 and the second PFET 526 turn on. This couples the source of the first NFET 520 to ground through the second NFET 522 and couples the source of the first PFET 524 to the supply rail through the second PFET 526. This allows the first NFET 520 and the first PFET 524 to function as a complementary inverter.

When the freeze is logic zero and the inverse freeze signal is logic one, the second NFET 522 and the second PFET 526 are turned off. This decouples the source of the first NFET 520 from ground and decouples the source of the first PFET 524 from the supply rail, which disables the first tri-state inverter 450 and causes the output 454 to have a high impedance by blocking current flow through the first NFET 520 and the first PFET 524.

FIG. 5C shows an exemplary implementation of the second tri-state inverter 460. In this example, the second tri-state inverter 460 includes a first NFET 530, a second NFET 532, a first PFET 534, and a second PFET 536. The gates of the first NFET 530 and the first PFET 534 are coupled to the first input 462 and the drains of the first NFET 530 and the first PFET 534 are coupled to the output 464. The gate of the second NFET 532 is coupled to the third input 468 to receive the inverse freeze signal, the drain of the second NFET 532 is coupled to the source of the first NFET 530, and the source of the second NFET 532 is coupled to ground. The gate of the second PFET 536 is coupled to the second input 466 to receive the freeze signal, the drain of the second PFET 536 is coupled to the source of the first PFET 534, and the source of the second PFET 536 is coupled to the supply rail for the first supply voltage Vdd1.

In this example, when the freeze signal is logic zero and the inverse freeze signal is logic one, the second NFET 532 and the second PFET 536 turn on. This couples the source of the first NFET 530 to ground through the second NFET 532 and couples the source of the first PFET 534 to the supply rail through the second PFET 536. This allows the first NFET 530 and the first PFET 534 to function as a complementary inverter.

When the freeze is logic zero and the inverse freeze signal is logic one, the second NFET 532 and the second PFET 536 are turned off. This decouples the source of the first NFET 530 from ground and decouples the source of the first PFET 534 from the supply rail, which disables the second tri-state inverter 460 and causes the output 454 to have a high impedance by blocking current flow through the first NFET 530 and the first PFET 534.

Figure 6:
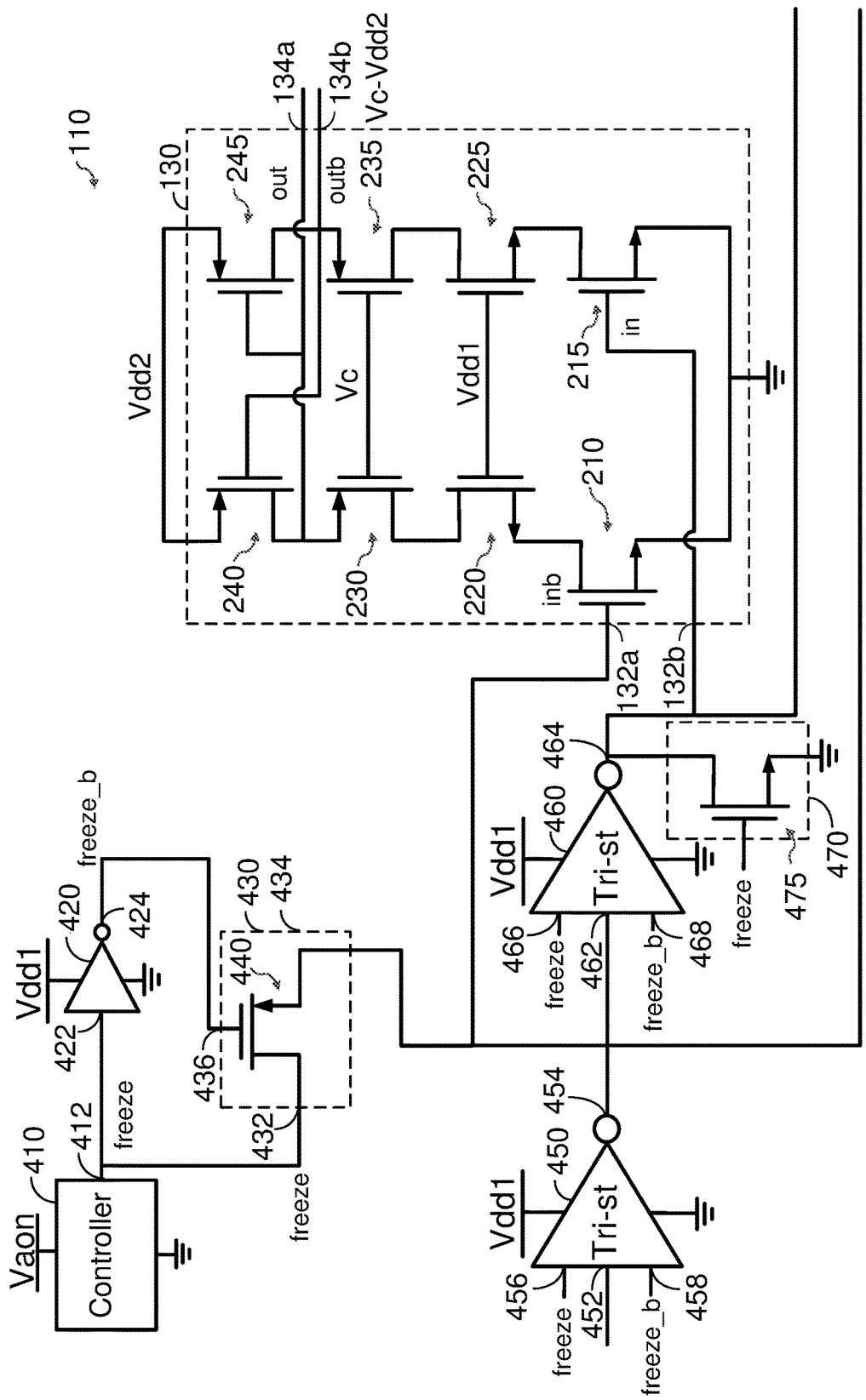
FIG. 6 shows another example of a circuit for selectively freezing the level shifter according to certain aspects of the present disclosure.

FIG. 6 shows another implementation of the freeze circuit in which the shunt switch 470 is coupled between the second input 132b of the level shifter 130 and ground, and the output 434 of the pass gate 430 is coupled to the first input 132a of the level shifter 130. For the example where the shunt switch 470 is implemented with the NFET 475, the drain of the NFET 475 is coupled to the second input 132b of the level shifter 130.

In this example, the operation of the freeze circuit in the first mode (e.g., functional mode) is the same as before in which the tri-state inverters 450 and 460 are enabled by the controller 410 and the tri-state inverters 450 and 460 drive the inputs 132a and 132b of the level shifter 130 based on the signal from the circuit 120 (shown in FIG. 1).

In this second mode, the controller 410 disables the tri-state inverters 450 and 460, turns on the shunt switch 470, and turns on the pass gate 430. This causes the shunt switch 470 to pull the second input 132b to ground and the pass gate 430 to output logic one to the first input 132a. Thus, in this example, the first input 132a is logic one and the second input 132b is logic zero. This turns on the first transistor 210 and turns off the second transistor 215, which cause the level shifter 130 to pull the first output 134a to approximately Vc and pull the second output 134b to approximately Vdd2. Thus, in the second mode, the voltage at the first output 134a is held at approximately Vc and the voltage at the second output 134b is held at approximately Vdd2.

Implementation examples are described in the following numbered clauses:

1. A system, comprising:
   a circuit in a first power domain;
   a first tri-state inverter having an input and an output, wherein the input of the first tri-state inverter is coupled to the circuit;
   a second tri-state inverter having an input and an output, wherein the input of the second tri-state inverter is coupled to the output of the first tri-state inverter;
   a level shifter in a second power domain, wherein the level shifter has a first input and a second input, the first input of the level shifter is coupled to the output of the first tri-state inverter, and the second input of the level shifter is coupled to the output of the second tri-state inverter;
   a shunt switch coupled between the first input of the level shifter and a ground;
   a controller; and
   a pass gate coupled between the controller and the second input of the level shifter.

2. The system of clause 1, wherein, in a first mode, the controller is configured to turn off the shunt switch, turn off the pass gate, enable the first tri-state inverter, and enable the second tri-state inverter.

3. The system of clause 2, wherein, in a second mode, the controller is configured to turn on the shunt switch, turn on the pass gate, disable the first tri-state inverter, and disable the second tri-state inverter.

4. The system of clause 3, wherein the controller is configured to output a logic one to the pass gate in the second mode.

5. The system of clause 3 or 4, wherein the first tri-state inverter and the second tri-state inverter are in the first power domain, and the first power domain is power collapsed during the second mode.

6. The system of any one of clauses 1 to 5, wherein the shunt switch comprises an n-type field effect transistor (NFET) and the pass gate comprises a p-type field effect transistor (PFET).

7. The system of any one of clauses 1 to 6, wherein the first power domain has a first supply voltage, and the second power domain has a second supply voltage greater than the first supply voltage.

8. The system of clause 7, wherein the first supply voltage is equal to or less than 80 percent of the second supply voltage.

9. The system of any one of clauses 1 to 8, further comprising a driver having a first input, a second input, and an output, wherein the first input of the driver is coupled to the output of the first tri-state inverter or the output of the second tri-state inverter, and the second input of the driver is coupled to an output of the level shifter.

10. The system of clause 9, further comprising a pad coupled to the output of the driver.

11. A system, comprising:
    a circuit in a first power domain;

a first tri-state inverter having an input and an output, wherein the input of the first tri-state inverter is coupled to the circuit;
a second tri-state inverter having an input and an output, wherein the input of the second tri-state inverter is coupled to the output of the first tri-state inverter;
a level shifter in a second power domain, wherein the level shifter has a first input and a second input, the first input of the level shifter is coupled to the output of the first tri-state inverter, and the second input of the level shifter is coupled to the output of the second tri-state inverter;
a shunt switch coupled between the second input of the level shifter and a ground;
a controller; and
a pass gate coupled between the controller and the first input of the level shifter.

12. The system of clause 11, wherein, in a first mode, the controller is configured to turn off the shunt switch, turn off the pass gate, enable the first tri-state inverter, and enable the second tri-state inverter.

13. The system of clause 12, wherein, in a second mode, the controller is configured to turn on the shunt switch, turn on the pass gate, disable the first tri-state inverter, and disable the second tri-state inverter.

14. The system of clause 13, wherein the controller is configured to output a logic one to the pass gate in the second mode.

15. The system of clause 13 or 14, wherein the first tri-state inverter and the second tri-state inverter are in the first power domain, and the first power domain is power collapsed during the second mode.

16. The system of any one of clauses 11 to 15, wherein the shunt switch comprises an n-type field effect transistor (NFET) and the pass gate comprises a p-type field effect transistor (PFET).

17. The system of any one of clauses 11 to 16, wherein the first power domain has a first supply voltage, and the second power domain has a second supply voltage greater than the first supply voltage.

18. The system of clause 17, wherein the first supply voltage is equal to or less than 80 percent of the second supply voltage.

19. The system of any one of clauses 11 to 18, further comprising a driver having a first input, a second input, and an output, wherein the first input of the driver is coupled to the output of the first tri-state inverter or the output of the second tri-state inverter, and the second input of the driver is coupled to an output of the level shifter.

20. The system of clause 19, further comprising a pad coupled to the output of the driver.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 90 percent of the stated value to 110 percent of the stated value.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A system, comprising:
a circuit in a first power domain;
a first tri-state inverter having an input and an output, wherein the input of the first tri-state inverter is coupled to the circuit;
a second tri-state inverter having an input and an output, wherein the input of the second tri-state inverter is coupled to the output of the first tri-state inverter;
a level shifter in a second power domain, wherein the level shifter has a first input and a second input, the first input of the level shifter is coupled to the output of the first tri-state inverter, and the second input of the level shifter is coupled to the output of the second tri-state inverter;
a shunt switch coupled between the first input of the level shifter and a ground;
a controller; and
a pass gate coupled between the controller and the second input of the level shifter.

2. The system of claim 1, wherein, in a first mode, the controller is configured to turn off the shunt switch, turn off the pass gate, enable the first tri-state inverter, and enable the second tri-state inverter.

3. The system of claim 2, wherein, in a second mode, the controller is configured to turn on the shunt switch, turn on the pass gate, disable the first tri-state inverter, and disable the second tri-state inverter.

4. The system of claim 3, wherein the controller is configured to output a logic one to the pass gate in the second mode.

5. The system of claim 3, wherein the first tri-state inverter and the second tri-state inverter are in the first power domain, and the first power domain is power collapsed during the second mode.

6. The system of claim 1, wherein the shunt switch comprises an n-type field effect transistor (NFET) and the pass gate comprises a p-type field effect transistor (PFET).

7. The system of claim 1, wherein the first power domain has a first supply voltage, and the second power domain has a second supply voltage greater than the first supply voltage.

8. The system of claim 7, wherein the first supply voltage is equal to or less than 80 percent of the second supply voltage.

9. The system of claim 1, further comprising a driver having a first input, a second input, and an output, wherein the first input of the driver is coupled to the output of the first tri-state inverter or the output of the second tri-state inverter, and the second input of the driver is coupled to an output of the level shifter.

10. The system of claim 9, further comprising a pad coupled to the output of the driver.

11. A system, comprising:
- a circuit in a first power domain;
- a first tri-state inverter having an input and an output, wherein the input of the first tri-state inverter is coupled to the circuit;
- a second tri-state inverter having an input and an output, wherein the input of the second tri-state inverter is coupled to the output of the first tri-state inverter;
- a level shifter in a second power domain, wherein the level shifter has a first input and a second input, the first input of the level shifter is coupled to the output of the first tri-state inverter, and the second input of the level shifter is coupled to the output of the second tri-state inverter;
- a shunt switch coupled between the second input of the level shifter and a ground;
- a controller; and
- a pass gate coupled between the controller and the first input of the level shifter.

12. The system of claim 11, wherein, in a first mode, the controller is configured to turn off the shunt switch, turn off the pass gate, enable the first tri-state inverter, and enable the second tri-state inverter.

13. The system of claim 12, wherein, in a second mode, the controller is configured to turn on the shunt switch, turn on the pass gate, disable the first tri-state inverter, and disable the second tri-state inverter.

14. The system of claim 13, wherein the controller is configured to output a logic one to the pass gate in the second mode.

15. The system of claim 13, wherein the first tri-state inverter and the second tri-state inverter are in the first power domain, and the first power domain is power collapsed during the second mode.

16. The system of claim 11, wherein the shunt switch comprises an n-type field effect transistor (NFET) and the pass gate comprises a p-type field effect transistor (PFET).

17. The system of claim 11, wherein the first power domain has a first supply voltage, and the second power domain has a second supply voltage greater than the first supply voltage.

18. The system of claim 17, wherein the first supply voltage is equal to or less than 80 percent of the second supply voltage.

19. The system of claim 11, further comprising a driver having a first input, a second input, and an output, wherein the first input of the driver is coupled to the output of the first tri-state inverter or the output of the second tri-state inverter, and the second input of the driver is coupled to an output of the level shifter.

20. The system of claim 19, further comprising a pad coupled to the output of the driver.

* * * * *